(12) United States Patent
Li

(10) Patent No.: US 12,412,680 B2
(45) Date of Patent: Sep. 9, 2025

(54) COMPOSITE SUPERCONDUCTING TAPE, COMBINATION AND PREPARATION METHOD THEREOF, AND DEFECT BYPASSING AND JOINT CONNECTION METHOD

(71) Applicant: SHANGHAI JIAO TONG UNIVERSITY, Shanghai (CN)

(72) Inventor: Xiaofen Li, Shanghai (CN)

(73) Assignee: SHANGHAI JIAO TONG UNIVERSITY, Shanghai (CN)

(\*) Notice: Subject to any disclaimer, the term of this patent is extended or adjusted under 35 U.S.C. 154(b) by 262 days.

(21) Appl. No.: 18/179,068

(22) Filed: Mar. 6, 2023

(65) Prior Publication Data

US 2023/0207156 A1 Jun. 29, 2023

Related U.S. Application Data

(63) Continuation of application No. PCT/CN2021/115523, filed on Aug. 31, 2021.

(30) Foreign Application Priority Data

Nov. 10, 2020 (CN) .......................... 202011246689.8

(51) Int. Cl.
*H01B 12/02* (2006.01)
*H01B 13/00* (2006.01)
*H01R 4/68* (2006.01)

(52) U.S. Cl.
CPC ......... *H01B 12/02* (2013.01); *H01B 13/0036* (2013.01); *H01R 4/68* (2013.01)

(58) Field of Classification Search
None
See application file for complete search history.

(56) References Cited

U.S. PATENT DOCUMENTS 6,569,360 B2 \* 5/2003 Wu ..................... H10N 60/0801
505/121
7,071,148 B1 \* 7/2006 Selvamanickam .... H10N 60/80
252/500

(Continued)

FOREIGN PATENT DOCUMENTS

CN 102637502 A 8/2012
CN 103210455 A 7/2013

(Continued)

*Primary Examiner* — Krystal Robinson

(57) ABSTRACT

A composite superconducting tape, a combination and preparation method thereof, and a defect bypassing or an end joint connection method. The composite superconducting tape includes a plurality of superconducting tapes, including a first superconducting tape and a second superconducting tape. The first superconducting tape includes a first superconducting layer, and the second superconducting tape includes a second superconducting layer. A side of the first superconducting tape close to the first superconducting layer is bonded with a side of the second superconducting tape close to the second superconducting layer along a length direction. The first superconducting tape is misaligned with the second superconducting tape along a width direction, such that the side of the first superconducting tape has a first vacant area for bonding with a second conductive tape, and the side of the second superconducting tape has a second vacant area for bonding with the first conductive tape.

10 Claims, 3 Drawing Sheets

(56) References Cited

U.S. PATENT DOCUMENTS

| | | | |
|---|---|---|---|
| 8,716,188 B2* | 5/2014 | Xie | H10N 60/203 29/599 |
| 2002/0020546 A1* | 2/2002 | Ueyama | H01R 4/68 174/125.1 |
| 2010/0075857 A1* | 3/2010 | Ayai | H10N 60/203 174/125.1 |
| 2012/0015816 A1* | 1/2012 | Yagi | H01R 4/68 505/150 |
| 2012/0065074 A1 | 3/2012 | Xie | |
| 2013/0203604 A1* | 8/2013 | Usoskin | H10N 60/83 174/125.1 |
| 2015/0045229 A1* | 2/2015 | Mitsuhashi | H01B 12/02 29/599 |
| 2015/0332812 A1* | 11/2015 | Takemoto | H10N 60/203 156/280 |
| 2016/0141080 A1* | 5/2016 | Otto | C22C 30/00 174/125.1 |
| 2018/0204658 A1* | 7/2018 | Osabe | H01F 6/06 |

FOREIGN PATENT DOCUMENTS

| | | |
|---|---|---|
| CN | 105593696 A | 5/2016 |
| CN | 107438887 A | 12/2017 |
| CN | 111226322 A | 6/2020 |
| KR | 20150114125 A | 10/2015 |
| WO | 2014109326 A1 | 7/2014 |
| WO | 2015011491 A1 | 1/2015 |

* cited by examiner

COMPOSITE SUPERCONDUCTING TAPE, COMBINATION AND PREPARATION METHOD THEREOF, AND DEFECT BYPASSING AND JOINT CONNECTION METHOD

CROSS-REFERENCE TO RELATED APPLICATIONS

This application is a continuation of International Patent Application No. PCT/CN2021/115523, filed on Aug. 31, 2021, which claims the benefit of priority from Chinese Patent Application No. 202011246689.8, filed on Nov. 10, 2020. The content of the aforementioned application, including any intervening amendments thereto, is incorporated herein by reference in its entirety.

TECHNICAL FIELD

This application relates to superconducting tapes, and more particularly to a composite superconducting tape, a combination and preparation method thereof, and a defect bypassing and joint connection method.

BACKGROUND

As a representative of multi-layer composite tape conductors, the rare-earth barium copper oxide (ReBCO) superconducting tape mainly includes a superconducting layer, a high-conductivity metal protective layer made of copper/silver (high-conductivity layer), an alloy substrate layer (low-conductivity substrate tape) and an insulating buffer layer (high-resistance layer) according to the descending order of conductivity. The ReBCO superconducting tape generally has a thickness of 0.1 mm and a width of 4-10 mm. Typically, the high-conductivity metal protective layer may be coated on a single side or both sides of the low-conductivity substrate tape. The two structures are less different from each other in terms of the conductive path due to the presence of the high-resistance layer. The tape material is divided by the high-resistance layer into an upper portion (where the superconducting layer exists) and a lower portion. In practical applications, especially in the transmission of large currents, the superconducting layer plays the most important role in the current conduction, and the metal protective layer on the upper portion is configured for current injection, current distribution, and current shunting under abnormal operation state. The lower portion hardly participates in the current conduction and distribution.

In large magnets, such as accelerator magnets or controllable fusion magnets, the application of superconductors is inseparable from the cable (also called strand or conductor) formed by the combination of multiple basic units (such as low-temperature superconducting wires and high-temperature superconducting tapes). Compared with low-temperature superconducting wires or Bi2Sr2Ca2Cu3Ox (Bi-2223) high-temperature superconducting tapes, the high-temperature ReBCO superconducting tapes can sustain high magnetic fields at high operating temperatures, but also struggle with current sharing problems caused by the high-resistance layer. In other superconducting wires, the superconducting part is surrounded by a metal matrix (copper or silver) with excellent electrical conductivity, such that the current distribution to other surrounding superconducting paths in any direction can be realized easily. However, regarding the predominant ReBCO structures, the current sharing or redistribution happens only through one direction, namely, through the surface protective layer). For two-tape structures, they can be combined face to face with each other, which has a satisfactory current distribution effect. When multiple tapes (more than two) are stacked in a twisted stacked-tape cable (TSTC) manner, or wound in a conductor on round core (CORC) manner, the current distribution is relatively difficult, even for the conductor with copper layers on both sides. In fact, the current distribution in the back direction is mainly dependent on the narrow path of the high-conductivity layer at the edges of the tape. It is always a challenge to achieve the current distribution between coated superconducting tapes, especially in the practical application of large-scale magnets.

SUMMARY

An objective of this application is to provide a composite superconducting tape, a combination and preparation method thereof, and a defect bypassing and joint connection method to overcome the deficiencies in the existing technologies.

Technical solutions of this application are described as follows.

In a first aspect, this application provides a composite superconducting tape, comprising:
a plurality of superconducting tapes; and
a plurality of conductor tapes;
wherein the plurality of superconducting tapes comprise a first superconducting tape and a second superconducting tape; the plurality of conductor tapes comprise a first conductive tape and a second conductive tape;
the first superconducting tape comprises a first superconducting layer; the second superconducting tape comprises a second superconducting layer; and a side of the first superconducting tape close to the first superconducting layer is bonded with a side of the second superconducting tape close to the second superconducting layer along a length direction;
the first superconducting tape and the second superconducting tape are misaligned along a width direction by a preset width, such that the side of the first superconducting tape bonded with the second superconducting tape has a first vacant area, and the side of the second superconducting tape bonded with the first superconducting tape has a second vacant area; and
the second vacant area is bonded with the first conductive tape; and the first vacant area is bonded with the second conductive tape.

In an embodiment, the first superconducting tape further comprises a first conductive layer and a first substrate tape; and the first conductive layer and the first substrate tape circumferentially wrap the first superconducting layer together.

The second superconducting tape further comprises a second conductive layer and a second substrate tape; the second conductive layer and the second substrate tape circumferentially wrap the second superconducting layer together.

In an embodiment, the first vacant area is bonded with the second conductive tape by welding or metal hot pressing; and the second vacant area is bonded with the first conductive tape by welding or metal hot pressing.

In an embodiment, the first conductive tape and the second conductive tape respectively comprise a copper tape.

In a second aspect, this application provides a superconducting tape combination, comprising:
a plurality of first composite superconducting tapes; and
a plurality of second composite superconducting tapes;

wherein each of the plurality of first composite superconducting tapes is the composite superconducting tape mentioned above; a structure of each of the plurality of first composite superconducting tapes is in mirror-symmetry with that of each of the plurality of second composite superconducting tapes; and the plurality of first composite superconducting tapes and the plurality of second composite superconducting tapes are alternately and stackedly bonded.

In an embodiment, one of the plurality of first composite superconducting tapes and a second composite superconducting tape adjacent thereto are stackedly bonded by welding, hot metal pressing or pressing with an external frame or a clamp.

In a third aspect, this application provides a method for preparing the superconducting tape combination, comprising: assembling a plurality of first composite superconducting tapes with a plurality of second composite superconducting tapes to obtain the superconducting tape combination; or assembling a plurality of superconducting tapes and a plurality of conductor tapes into the superconducting tape combination.

In an embodiment, the plurality of superconducting tapes and the plurality of conductor tapes are stackedly bonded by welding, hot metal pressing or pressing with an external frame or a clamp.

In a third aspect, this application provides a defect bypassing and joint connection method of the composite superconducting tape mentioned above, comprising:

(S1) determining a defect position (including an end of one tape) on the composite superconducting tape; and selecting a first position and a second position along a length direction of the composite superconducting tape, wherein the defect position is located between the first position and the second position; and (S2) replacing a section of the first conductive tape between the first position and the second position and/or a section of the second conductive tape between the first position and the second position with a superconducting tape.

In a fourth aspect, this application provides a defect bypassing and joint connection method of the superconducting tape combination mentioned above, comprising:

(S1) determining a defect position (including an end of one tape) on the superconducting tape combination; and selecting a first position and a second position along a length direction of the superconducting tape combination, wherein the defect position is located between the first position and the second position; and (S2) replacing a section of the first conductive tape between the first position and the second position and/or a section of the second conductive tape between the first position and the second position with a superconducting tape.

Compared with the prior art, this application has the following beneficial effects.

1. In this application, multiple strands of superconducting tapes are combined in parallel as a basic unit (i.e., superconducting cable or conductor) for winding large-scale magnets. In the traditional parallel structure, the realization of current exchange between individual conductors is relatively difficult due to the special structure of ReBCO superconducting tapes. However, the current exchange among conductors is of great significance to the full utilization of materials and the electrical and thermal stability of the conductors, and thus has been extensively investigated. By means of the staggered conductor path facing both sides provided herein, the low-resistance current path between the tapes is improved from a narrow path only at the edge to a wide path, notably improving the current redistribution.

2. The superconducting layer is basically located in a mechanically-symmetrical center plane of the entire structure, such that the effect of the mechanical deformation (such as bending) on the superconducting coating layer is neutralized, enhancing the mechanical properties of the superconducting tapes.

3. In this disclosure, the limitation on the production length of a single superconducting tape can be eliminated, and the joints can be added where required, such that the yield rate of the superconducting tapes is significantly improved, and the length of the continuous superconducting tape can be extended to any length. Compared with ordinary tape joints, the joint provided herein does not suffer thickness and mechanical property variation.

BRIEF DESCRIPTION OF THE DRAWINGS

Other technical features, objectives and advantages of this disclosure will become clearer upon reading the detailed description of the embodiments with reference to the accompanying drawings.

FIG. 2b schematically shows a structure of a double-side conductive composite superconducting tape according to another embodiment of the disclosure, which is a mirror reflection of that shown in FIG. 2a;

DETAILED DESCRIPTION OF EMBODIMENTS

The disclosure will be described in detail below with reference to the embodiments and accompanying drawings to make the objectives, technical solutions, and advantages clearer. The following embodiments are only intended to help those skilled in the art to better understand this application, but not to limit this application. It should be noted that various changes and modifications made by hose skilled in the art without departing from the spirit of the application should still fall within the scope of this application defined by the appended claims.

Figure 1A:
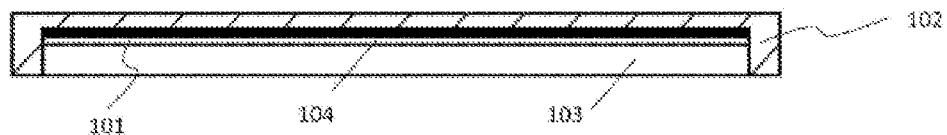
FIG. 1a schematically shows a structure of a conventional single-side coated multi-layer composite tape conductor.
Figure 1B:
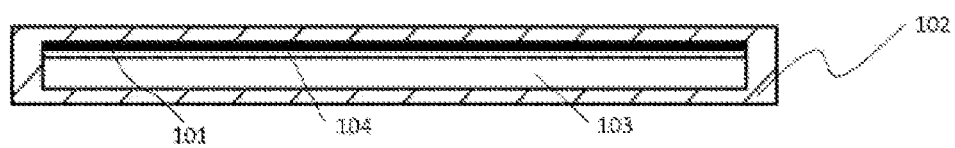
FIG. 1b schematically shows a structure of a conventional double-side coated multi-layer composite tape conductor.

FIGS. 1a and 1b illustrate two kinds of conventional rare-earth barium copper oxide (ReBCO) superconducting tapes, mainly including a superconducting layer 101, a high-conductivity metal protective layer made of copper/silver (conductive layer 102), an alloy substrate layer (substrate tape 103) and an insulating buffer layer (high-resistance layer 104) according to the descending order of conductivity.

Provided herein is a composite superconducting tape. Referring to an embodiment shown in FIGS. 2a and 2b, the composite superconducting tape includes a plurality of superconducting tapes and a plurality of conductor tapes. In this embodiment, the plurality of superconducting tapes includes a first superconducting tape 100 and a second superconducting tape 300.

Figure 3:
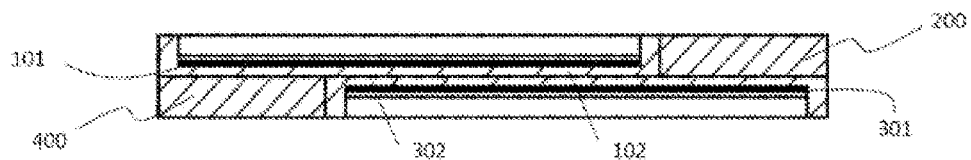
FIG. 3 is a cross-sectional view of the double-side conductive composite superconducting tape according to an embodiment of the disclosure.

Referring to an embodiment shown in FIG. 3, the first superconducting tape 100 includes a first superconducting layer 101. The second superconducting tape 300 includes a second superconducting layer 301. A side of the first superconducting tape 100 close to the first superconducting layer 101 is bonded with a side of the second superconducting tape 300 close to the second superconducting layer 301 along a length direction. The first superconducting tape 100 and the second superconducting tape 300 are misaligned along a width direction by a preset width, such that the side of the first superconducting tape 100 bonded with the second superconducting tape 300 has a first vacant area, and the side of the second superconducting tape 300 bonded with the first superconducting tape 100 has a second vacant area.

The second vacant area is bonded with a first conductive tape 200. The first vacant area is bonded with a second conductive tape 400.

The first superconducting tape 100 further comprises a first conductive layer 102 and a first substrate tape 103. The first conductive layer 102 and the first substrate tape 103 circumferentially wrap the first superconducting layer 101 together. The second superconducting tape 300 further comprises a second conductive layer 302 and a second substrate tape 303. The second conductive layer 302 and the second substrate tape 303 circumferentially wrap the second superconducting layer 301 together.

The first conductive tape 200 is bonded with the second superconducting tape 300 by welding or metal hot pressing; and the second conductive tape 400 is bonded with the first superconducting tape 100 by welding or metal hot pressing.

The first conductive tape 200 and the second conductive tape 400 respectively include a conventional conductor tape (preferably copper tape) whose electrical conductivity is between the electrical conductivity of the substrate tape and the electrical conductivity of the superconducting layer. Four tapes (including two composite superconducting tapes and two conventional conductor tapes) are bonded to form a monolithic structure, where the width ratio of the superconducting tape to the high-conductivity tape are allowed to be selected relatively free. As shown in FIG. 3, a provided structure has the width ratio of the metal to the superconducting tape of 1:2. In the structure shown in FIG. 3, any double-side conductive composite superconducting tapes facing in any direction (up and down) each have a large metal contact surface. Taking the scale of the real object into account, the resistance of the current distribution path is reduced by one to two orders of magnitude.

Figure 2A:
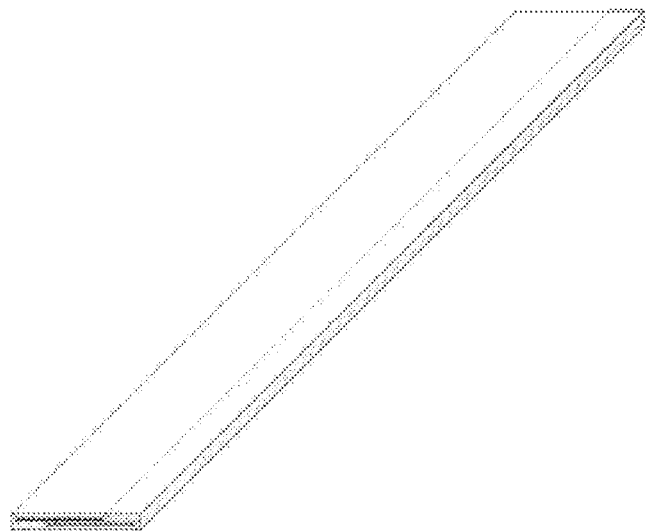
FIG. 2a schematically shows a structure of a double-side conductive composite superconducting tape according to an embodiment of the disclosure.
Figure 2B:
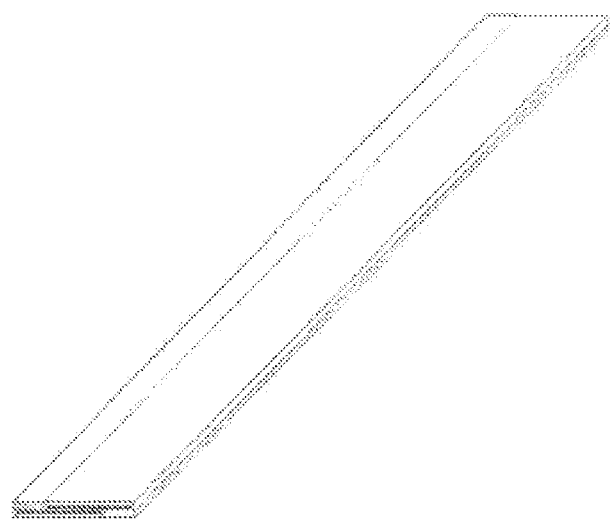
Figure 2C:
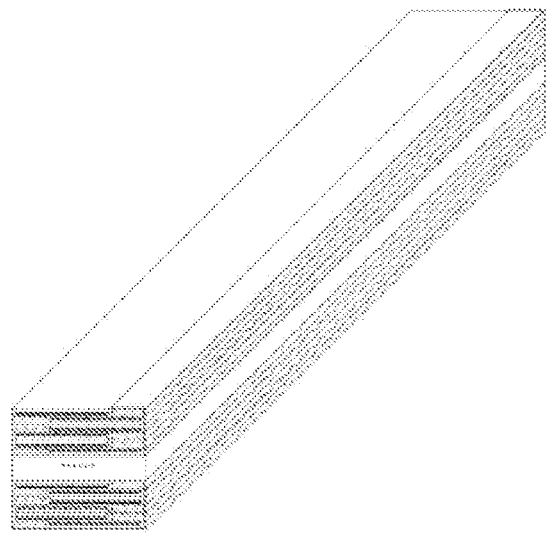
FIG. 2c structurally shows a superconducting tape combination formed by the structures shown in FIGS. 2a and b.
Figure 4:
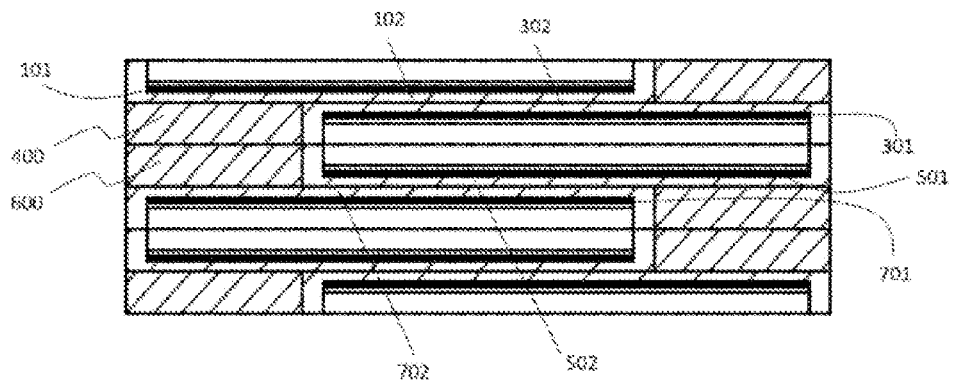
FIG. 4 is a cross-sectional view of the superconducting tape combination according to an embodiment of the disclosure.

When multiple double-side conductive composite superconducting tapes are used, for example, under the simple stacking, the double-side tape shown in FIG. 2a and the double-side tape shown in FIG. 2b are mirror-symmetric, and multiple double-side tapes shown in FIG. 2a and multiple double-side tapes shown in FIG. 2b are alternately stacked to obtain a combination. The combination is structurally shown in FIG. 2c, and the cross section of the combination is shown in FIG. 4. In the combination, the current is allowed to be distributed among any tapes along a low-resistance path. For example, the current in the second superconducting layer 301 shown in FIG. 4 is distributed to the third superconducting layer 501. The low-resistance path is shown as: 301→302→102→101→102→400→600→702→701→702→502→501. Based on the property of each section in the tape, it seems that the path is complicated, but the path is actually a low-resistance path. The arrows shown on the low-resistance path indicate a vertical path. Each arrow corresponds to a short low-resistance path with a large contact surface. While the current along a horizontal direction are required to pass through the first superconducting layer 101 and a fourth superconducting layer 701 for distribution, the resistance of which is negligible.

The superconducting tape stack can be formed by combining the ordinary tapes into double-side tapes, and then simply stacking the double-side tapes by pressing, welding, hot metal pressing or simple pressing with an external frame, clamps or other methods, such as metal grooves. Or the double-side tape construction can be skipped, and the stacking structure can be formed directly from individual superconducting and highly conductive tapes, or even remove the conductive tapes, fill the space with soldering material or leave it empty. In the stack, a plurality of metal tapes can be added among the tapes as required to change the proportion of superconductors.

In addition, if the double-side tape structure provided herein is applied to interwoven structures such as cables and conductor on round core (CORC), the sufficient current exchange can be realized without requiring two mirror-symmetrical double-side tape structures.

Figure 5:
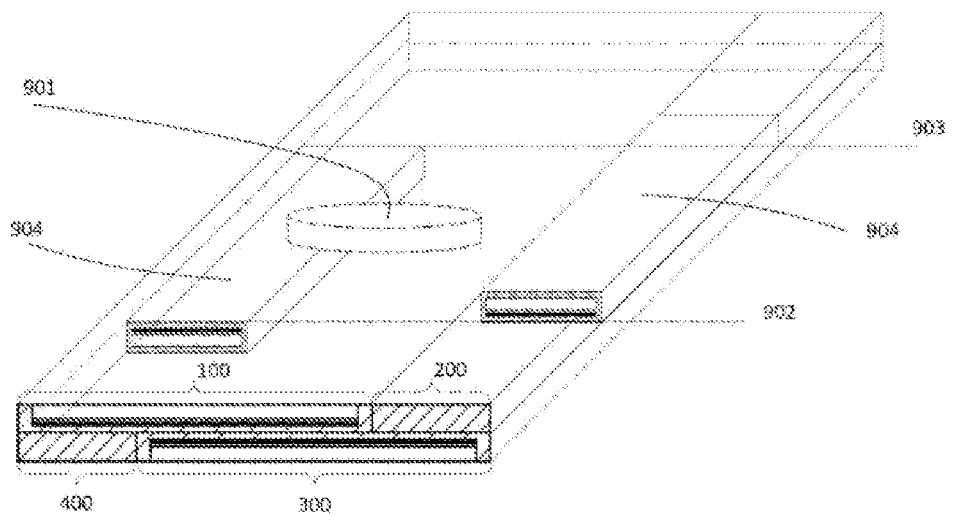
FIG. 5 schematically shows a structure of a defect bypassing or an end joint according to an embodiment of the disclosure.

The double-side tape further has an advantage that the joints can be added without affecting the thickness of the tape and changing the direction and mechanical properties of the flow surface of the tape. As shown in FIG. 5, assuming that one of the double-side tapes, namely the first superconducting tape 100, has a defect at a defect position 901, which is a point with low current or even a break point in the tape. Then, a first position 902 and a second position 903 are selected, and one or both of the first conductive tape 200 and the second conductive tape 400 between the first position 902 and the second position 903 are replaced with the superconducting narrow tape 904. Due to the satisfactory shunting characteristics of the double-side tape structure, when the current passes through the joint, the current originally carried by the first superconducting tape 100 is configured to be diverted to the second superconducting tape 300 and the superconducting narrow tape 904 for partial or full distribution at the expense of a relatively small voltage, and flow back to the first superconducting tape 100 where the defect is passed. Compared with the conventional joints, where overlap of tapes happens, the joint provided herein does not cause any noticeable variation in thickness, mechanical properties or tape directions.

This application further provides two joint connection or transition methods, which are described as follows.

In the case of the double-side conductive composite superconducting tape or the combination does not include the high-conductivity tapes:

(S1) The first position 902 and the second position 903 are selected along a length direction of the superconducting tape. The defect position 901 is located on the superconducting tape between the first position 902 and the second position 903.

(S2) On the superconducting tape section, the vacant area of the second superconducting tape 300 and/or the vacant area of the first superconducting tape 100 are respectively provided with the superconducting narrow tape 904.

In the case of the double-side conductive composite superconducting tape or the combination includes the high-conductivity tapes:

(S1) The first position 902 and the second position 903 are selected along a length direction of the superconducting tape. The defect position 901 is located on the superconducting tape between the first position 902 and the second position 903.

(S2) Both or one of the high-conductive tapes on the superconducting tape section are replaced with the superconducting narrow tape 904.

It should be noted that the orientation or positional relationship indicated by the terms, such as "up", "front", "rear", "left", "right", "vertical", "horizontal", "top", "bottom", "down", "inner" and "outer" is based on the orientation or positional relationship shown in the accompanying drawings, and these terms are merely intended to simplify the description and facilitate the understanding, rather than indicating or implying that the referred device or element must have a particular orientation, or be constructed and operated in a particular orientation, and thus should not be construed as a limitation to this application.

The embodiments described above are merely illustrative of this application, and are not intended to limit this application. It should be understood that various variations and modifications made by those skilled in the art without departing from the scope of the present application shall fall within the scope of the application defined by the appended claims. In the absence of contradiction, the embodiments of this application or the technical features in the embodiments can be arbitrarily combined with each other.

What is claimed is:

1. A composite superconducting tape, comprising:
   a plurality of superconducting tapes; and
   a plurality of conductor tapes;
   wherein the plurality of superconducting tapes comprise a first superconducting tape and a second superconducting tape; the plurality of conductor tapes comprise a first conductive tape and a second conductive tape;
   the first superconducting tape comprises a first superconducting layer; the second superconducting tape comprises a second superconducting layer; and a side of the first superconducting tape close to the first superconducting layer is bonded with a side of the second superconducting tape close to the second superconducting layer along a length direction;
   the first superconducting tape and the second superconducting tape are misaligned along a width direction by a preset width, such that the side of the first superconducting tape bonded with the second superconducting tape has a first vacant area, and the side of the second superconducting tape bonded with the first superconducting tape has a second vacant area; and
   the second vacant area is bonded with the first conductive tape; and the first vacant area is bonded with the second conductive tape.

2. The composite superconducting tape of claim 1, wherein the first superconducting tape further comprises a first conductive layer and a first substrate tape; and the first conductive layer and the first substrate tape circumferentially wrap the first superconducting layer together;
   the second superconducting tape further comprises a second conductive layer and a second substrate tape; the second conductive layer and the second substrate tape circumferentially wrap the second superconducting layer together.

3. The composite superconducting tape of claim 1, wherein the first vacant area is bonded with the second conductive tape by welding or metal hot pressing; and the second vacant area is bonded with the first conductive tape by welding or metal hot pressing.

4. The composite superconducting tape of claim 1, wherein the first conductive tape and the second conductive tape respectively comprise a copper tape.

5. A superconducting tape combination, comprising:
   a plurality of first composite superconducting tapes; and
   a plurality of second composite superconducting tapes;
   wherein each of the plurality of first composite superconducting tapes is the composite superconducting tape of claim 1; a structure of each of the plurality of first composite superconducting tapes is in mirror-symmetry with that of each of the plurality of second composite superconducting tapes; and the plurality of first composite superconducting tapes and the plurality of second composite superconducting tapes are alternately and stackedly bonded.

6. The superconducting tape combination of claim 5, wherein one of the plurality of first composite superconducting tapes is stackedly bonded with a second composite superconducting tape adjacent thereto by welding, hot metal pressing, or pressing with an external frame, or a clamp.

7. A method for preparing the superconducting tape combination of claim 5, comprising:
   assembling the plurality of first composite superconducting tapes with the plurality of second composite superconducting tapes to obtain the superconducting tape combination; or
   assembling a plurality of superconducting tapes and a plurality of conductor tapes into the superconducting tape combination.

8. The method of claim 7, wherein the plurality of superconducting tapes and the plurality of conductor tapes are stackedly bonded by welding, hot metal pressing, or pressing with an external frame, or a clamp.

9. A defect bypassing and joint connection method using the superconducting tape combination of claim 5, comprising:
   (S1) determining a defect position on the superconducting tape combination; and selecting a first position and a second position along a length direction of the superconducting tape combination, wherein the defect position is located between the first position and the second position; and
   (S2) replacing a section of the first conductive tape between the first position and the second position and/or a section of the second conductive tape between the first position and the second position with a superconducting tape.

10. A defect bypassing and joint connection method using the composite superconducting tape of claim 1, comprising:
   (S1) determining a defect position on the composite superconducting tape; and selecting a first position and a second position along a length direction of the composite superconducting tape, wherein the defect position is located between the first position and the second position; and
   (S2) replacing a section of the first conductive tape between the first position and the second position and/or a section of the second conductive tape between the first position and the second position with a superconducting tape.

* * * * *